US00RE39224E

(19) United States
(12) Reissued Patent
Tang et al.

(10) Patent Number: US RE39,224 E
(45) Date of Reissued Patent: Aug. 8, 2006

(54) APPARATUS AND METHOD FOR MAKING UNIFORMLY SIZED AND SHAPED SPHERES

(75) Inventors: Jie Tang, Fogelsville, PA (US); Gary B. Hess, Onsted, MI (US); Mark D. Muszynski, Manchester, MI (US); Thomas S. Goehring, Jackson, MI (US)

(73) Assignee: Alpha Metals (Korea) Ltd. (KR)

(21) Appl. No.: 09/827,605

(22) Filed: Apr. 6, 2001

Related U.S. Patent Documents

Reissue of:
(64) Patent No.: 5,891,212
Issued: Apr. 6, 1999
Appl. No.: 08/931,295
Filed: Sep. 16, 1997

U.S. Applications:
(63) Continuation-in-part of application No. 08/892,145, filed on Jul. 14, 1997, now abandoned.

(51) Int. Cl.
*B06B 1/20* (2006.01)
*B22F 9/08* (2006.01)

(52) U.S. Cl. ..... 75/335; 75/345; 264/9
(58) Field of Classification Search ..... 75/335, 75/332, 345, 331; 264/9, 13
See application file for complete search history.

(56) References Cited

U.S. PATENT DOCUMENTS

| | | | | | |
|---|---|---|---|---|---|
| 3,933,679 | A | * | 1/1976 | Weitzel et al. | 264/9 |
| 3,986,899 | A | * | 10/1976 | Kole et al. | 148/24 |
| 4,216,178 | A | * | 8/1980 | Anderson | 264/9 |
| 4,302,166 | A | * | 11/1981 | Fulwyler et al. | 425/6 |
| 4,419,303 | A | * | 12/1983 | Anderson | 264/9 |
| 4,428,894 | A | * | 1/1984 | Bienvenu | 264/9 |
| 4,628,040 | A | * | 12/1986 | Green et al. | 502/9 |
| 4,744,821 | A | * | 5/1988 | Yabuki et al. | 75/340 |
| 4,787,935 | A | * | 11/1988 | Eylon et al. | 75/338 |
| 4,871,489 | A | * | 10/1989 | Ketcham | 264/9 |
| 4,956,128 | A | * | 9/1990 | Hommel et al. | 264/4 |
| 4,981,625 | A | * | 1/1991 | Rhim et al. | 264/13 |
| 5,032,172 | A | * | 7/1991 | Overfelt et al. | 75/255 |
| 5,147,448 | A | * | 9/1992 | Roberts et al. | 75/331 |
| 5,171,360 | A | * | 12/1992 | Orme et al. | 164/46 |
| 5,226,948 | A | * | 7/1993 | Orme et al. | 75/331 |
| 5,266,098 | A | * | 11/1993 | Chun et al. | 75/335 |
| 5,411,602 | A | * | 5/1995 | Hayes | 148/23 |
| 5,511,449 | A | * | 4/1996 | Feigenbaum | 75/341 |
| 5,520,715 | A | * | 5/1996 | Oeftering | 75/335 |
| 5,560,543 | A | * | 10/1996 | Smith et al. | 239/102.2 |
| 5,609,919 | A | * | 3/1997 | Yuan et al. | 427/426 |
| 5,746,844 | A | * | 5/1998 | Sterett et al. | 148/522 |

FOREIGN PATENT DOCUMENTS

| | | | |
|---|---|---|---|
| EP | 0467221 | * | 1/1992 |
| FR | 2595595 | * | 9/1987 |
| JP | 06/091204 | * | 4/1994 |
| SU | 1682039 | * | 10/1988 |
| WO | PCT/US98/11588 | * | 8/1998 |

OTHER PUBLICATIONS

Christian Henry Passow, A Study of Spray Forming Using Uniform Droplet Sprays, 1992, Thesis presented to the Department of Mechanical Engineering at MIT on May 5, 1992.*

* cited by examiner

*Primary Examiner*—George Wyszomierski
(74) *Attorney, Agent, or Firm*—Mintz, Levin, Cohn, Ferris, Glovsky and Popeo, P.C.

(57) ABSTRACT

Uniform sized and shaped spheres are formed by applying a minute periodic disturbance to a low viscosity liquid material. Pressure forces the material through at least one orifice in a crucible as a steady laminar stream. The stream enters an enclosed controlled temperature solidification environment which contains at least one heat transfer medium. A charging means is applied to the stream as the stream exits the crucible and breaks into a plurality of spheres to deflect the spheres as they pass through an electric field. The enclosed controlled temperature solidification environment cools and substantially solidifies the spheres.

40 Claims, 3 Drawing Sheets

APPARATUS AND METHOD FOR MAKING UNIFORMLY SIZED AND SHAPED SPHERES

Matter enclosed in heavy brackets [ ] appears in the original patent but forms no part of this reissue specification; matter printed in italics indicates the additions made by reissue.

This is a continuation-in-part of U.S. patent application Ser. No. 08/892,145 filed Jul. 14, 1997, now abandoned.

FIELD OF INVENTION

The present invention is concerned with producing evenly sized and evenly shaped spheres or balls. In one aspect, the invention relates to making uniformly sized metallic spheres for use in solder compositions.

BACKGROUND OF THE INVENTION

Various methods have been proposed to form droplets of material having a known size. The present invention is an improvement over the method described in the Chun et al. U.S. Pat. No. 5,266,098 which is expressly incorporated herein by reference. The Chun et al. '098 describes placing a charge on a droplet in an attempt to produce uniformly sized droplets. The Chun et al. method produced a high percent of unacceptable and unusable pieces or bits of material having flat, oblong or irregular shapes. The Chun et al. method is limited to producing irregularly shaped droplets having undesirably rough and bumpy surfaces.

Other previously considered methods for forming droplets by imparting a charge on the droplets include: Smith U.S. Pat. No. 5,560,543 describes a method for forming droplets and passing droplets through charged and grounded plates to selectively deflect droplets. Soviet Patent No. 541682039-A1 describes forming droplets which acquire a charge by passing through an electric field. Orme et al. U.S. Pat. Nos. 5,171,360; 5,226,948; 5,259,593 and 5,340,090 describe methods and apparatuses for forming a net product by directing a stream of uniformly sized droplets onto a collector of the shape of the desired product. C. H. Passow thesis, The Massachusetts Institute of Technology (MIT) May 1992, describes forming uniform droplets by using parallel plates positioned below a charging plate to selectively deflect some droplets off to one side where they are collected.

Various other methods proposed to form droplets include: Hayes U.S. Pat. No. 5,411,602 describes ejecting solder drops from an ejection device into a flow of inert gas and catching the solidified solder balls; Hommel et al. U.S. Pat. No. 4,956,128 describes an aqueous calcium chloride hardening solution through which droplets are passed; Yabuki et al. U.S. Pat. No. 4,744,821 describes forming drops and passing the drops through layers of oil and water; Fulwyler et al. U.S. Pat. No. 4,302,166 describes a droplet forming apparatus where the droplets fall into an aqueous solution of a nonionic surfactant; Green et al. U.S. Pat. No. 4,628,040 describes forming droplets using a venturi process where the droplets pass through an oil to harden the droplets; Eylon et al. U.S. Pat. No. 4,787,935 describes a method for making powders using swirling, cooling fluids to harden the droplets; Anderson U.S. Pat. Nos. 4,216,718 and 4,419,303 describe forming sodium amalgam particles for high pressure discharge lamps where a vibrating discharge nozzle forms droplets which fall into a fluid; Rhim et al. U.S. Pat. No. 4,981,625 describes forming polymeric microspheres by ejecting droplets of monomers, charging the droplets, freezing the droplets in a cryogenic liquid, and thawing the droplets by irradiation to activate free radicals which polymerize the monomer.

The prior art droplet formation methods have not been entirely satisfactory for a number of reasons. A major concern is the wide distribution of the particle size of the droplets. Inconsistent sizes in the droplets makes the use of the droplets more difficult in soldering applications. Another problem is that after the formation of the droplets, the droplets have to be cleaned to remove contaminants or oxides on the surface or to remove oils and solutions through which the droplets have been passed. The cleaning of the droplets adds to the manufacturing time and costs.

Another major concern is that the droplets have irregular shapes and/or bumpy or rough surfaces. This lack of sphericity makes handling and use of the individual droplets more difficult.

Therefore, it is an object of the present invention to develop an apparatus and method for manufacturing high quality uniformly sized and shaped droplets. The present invention further provides a process which does not involve the use of multiple formation steps and/or cleaning steps.

BRIEF DESCRIPTION OF THE INVENTION

The present invention provides a highly accurate method and apparatus for producing uniformly sized and shaped spheres of a desired material, or materials. The apparatus comprises a sphere generation means and a controlled temperature solidification environment. In preferred embodiments, the spheres are formed using a uniform sphere generation means where a low viscosity liquid material is supplied into a crucible or feed system. The crucible has a means for heating and melting the material. The low viscosity liquid material in the crucible is subjected to a certain periodic disturbance by a stimulation actuator means. The crucible has at least one orifice which permits passage of the material therethrough. The material is subjected to a pressure differential (preferably about 4–50 psi) which forces the material through the orifice as a stream. The periodic disturbance applied to the material causes a controlled breakup of the stream of material into uniformly sized spheres. As the spheres are formed, the spheres are subjected to a positive or negative charge by a charging means. When the charging means is held at a predetermined voltage with respect to the stream, the combination of the voltage and the capacitance between the charging means and the stream brings a charge to the leading point of the stream. Each sphere retains a charge that the sphere held before it broke free from the stream. The charge on the sphere causes each sphere to repel from adjacent spheres. The like charge on the individual spheres prevents the spheres from merging together in flight with neighboring or adjacent spheres.

In an especially preferred embodiment, the stream is broken by introducing minute periodic disturbances (preferably from about 1 to 30 kHz) by the stimulation actuator means. In certain embodiments the stimulation actuator means comprises either an electromechanical or piezoelectrical transducer. In one especially preferred embodiment, the transducer comprises a stack of five piezoelectric crystals mounted on a top portion of the crucible. The bottom four crystals are mechanically connected in serial and are electrically connected in parallel to a high sinusoidal voltage source. The top piezoelectric crystal serves as a motion sensor. The output voltage is an indication of the amplitude of the stimulation actuator means. In an alternative embodiment, the periodic disturbance or stimulation of the material can be obtained from a monolithic multilayer piezoelectric stimulation actuator. One preferred type of multilayer actuator has the following dimensions: length 5 mm, height 5 mm and width 5 mm. The multilayer actuator contains about 29 piezoelectric ceramic layers cofired together. The multilayer actuator is capable of over 3 micron expansion. In certain embodiments, an extender means, such as a rod, is attached to the bottom of the stimulation actuator means and extends into the supply of the material. The stimulation actuator means transfers the minute periodic disturbances to the material through the rod.

In a different embodiment, the stimulation actuator means can comprise a piezoelectric ceramic material having a nozzle which is connected to the voltage source. The nozzle has a fixed aspect ratio defining the orifice in the crucible. The sinusoidal voltage is directly applied on the nozzle causing a minute periodic disturbance which radiates into the stream of material through the nozzle wall. It is contemplated that in certain very high temperature applications (for example, where the temperature of the low viscosity liquid material is over about 300° C.), a lithium niobate ($LiNoO_3$) material can be used instead of a piezoelectric ceramic material.

At least one pressure regulator means supplies a constant hydrostatic pressure in the crucible. In a preferred embodiment, the pressure regulator means keeps the crucible at a negative pressure before the operation of the sphere generation means. The negative pressure prevents the material from dripping out of the nozzle. In a preferred embodiment, the pressure regulator means keeps the crucible at a positive pressure during the operation of the sphere generation means by maintaining the low viscosity liquid material at a desired level in the crucible. In a preferred embodiment, the pressure regulator means supplies a dry and inert gas, such as nitrogen, onto the low viscosity liquid material in the crucible. The positive pressure forces the material out through the orifice in the crucible. The amount of pressure on the material controls the flow of the material through the orifice. During operation of the sphere generation means, the applied constant positive pressure forces the material out of the nozzle and forms the jet or stream. The sinusoidal frequency from the stimulation actuator causes a minute periodic disturbance to the stream. Due to the Rayleigh instability effect, the disturbance builds due to energy of momentum in the stream, breaking the stream into uniform sized and uniform spaced spheres. The space between two neighboring spheres $\lambda$ is a function of the jet speed $v_j$ and the stimulation frequency, $\lambda=v_j/f$.

In certain embodiments, the present invention provides a deflection means which is in a spaced apart relationship to the charging means. The deflection means comprises at least one set of deflection surfaces which are spatially separated from each other. A high voltage is applied across the set of deflection surfaces to generate an electric field between the surfaces. The deflection means creates an electrical force field through which the spheres pass. Since the spheres are charged, the electric field deflects on the spheres, depending upon their polarity. The deflection means spatially separates the spheres in the plane perpendicular to a center or vertical axis, further preventing the spheres from merging, thus further maintaining size consistency.

The deflection distance of the spheres is a function of the size and speed of the spheres, the charge of the spheres and the force of the deflection field. The bigger spheres remain close to the center axis through the deflection means while the smaller spheres are deflected further away from the center axis.

A visual observation system is positioned in a spaced apart relationship to the orifice in the crucible to monitor the formation of the spheres and to measure the size of the spheres. The visual observation system, in preferred embodiments, is operatively connected to the stimulation actuator means to increase or decrease the periodic disturbance being supplied to the low viscosity liquid material. The visual observation system is also operatively attached to the deflection means which increases, maintains or decreases the charge on the spheres in response to the information being collected by the visual observation system.

The present invention is an improvement over the Chun et al. '098 technology where the droplets are not formed in a temperature controlled environment. According to another aspect of the present invention, the sphere generation means is operatively positioned in a controlled temperature solidification environment. The controlled temperature solidification environment allows the spheres to be formed in a short amount of time and distance. Also, the controlled temperature solidification environment provides less risk of contamination, such as oxidation, from occurring on the surface of the spheres. The controlled temperature solidification environment contains at least one heat transfer medium, such as a cold or liquified gas. The heat transfer medium provides a solidification environment where the spheres are cooled and solidified in a controlled manner. In certain embodiments the controlled temperature solidification environment provides a thermal gradient which allows the spheres to be quickly cooled in a controlled manner so that the spheres being formed have a consistently round or spherical shape in addition to a uniform size. In an embodiment where a tin-lead alloy is being used to form spheres for solder, the thermal gradient in the controlled temperature solidification environment ranges from about room temperature to about −90° C. (and in certain embodiments about 0° C.) in an upper chamber adjacent the crucible and ranges from about −110° to about −170° C. in a lower chamber adjacent a bottom of the controlled temperature solidification environment. In other embodiments where different low viscosity liquid materials are being formed in spheres, the temperatures in the solidification environment are regulated so that the spheres form both quickly and uniformly. The temperatures in the controlled temperature solidification environment are affected by the type of heat transfer medium being used. It is to be understood that various heat transfer media, including liquified gases, halo-carbon fluids, ammonia, water and steam are within the contemplated scope of the present invention and that the temperatures of the heat transfer media can range from about room temperature to about −200° C., depending upon the type of low viscosity liquid material being used to form the spheres.

In embodiments where the low viscosity liquid material comprises a material which solidifies by radiating heat, for example, metals such as copper and steel, different types of heat transfer media may be used and the heat transfer media may be supplied at different temperatures. For example, in embodiments where titanium spheres are being formed the heat transfer medium can comprise a heated gas or vapor.

In certain embodiments, it has been found that the contact of the spheres by rapidly moving or flowing heat transfer medium tends to cause the spheres to have uneven shapes. Therefore, in certain preferred embodiments, it is desired that there be as little movement or flow of the heat transfer medium. The heat transfer medium present in the controlled temperature solidification environment is substantially at rest or still such that there are generally no currents or flows of medium to contact or misshape the spheres being formed.

In certain embodiments, the controlled temperature solidification environment comprises a first or gaseous environment containing a first heat transfer medium and a second or liquid environment containing a second heat transfer medium. In other embodiments the controlled temperature solidification environment comprises the first or gaseous environment without the use of the second or liquid environment. However, the description herein will describe in detail the gaseous/liquid controlled temperature solidification environment in order to provide a full understanding of all embodiments of the present invention. It should be further understood that all the embodiments are within the contemplated scope of the present invention. The use of the gaseous/liquid controlled temperature solidification environment is especially useful in the formation of spheres from relatively soft or malleable materials and in the formation of spheres which have large diameters or have a high latent heat of fusion (i.e., the quantity of heat evolved in the transformation of the material from the liquid phase to the solid phase).

As the spheres exit the deflection means the spheres begin to solidify by first forming a skin or shell on the outer surface of the sphere. Before the spheres exit the gaseous environment zone, the spheres have substantially solidified, i.e., the heat of fusion has been transferred from the spheres to the gaseous heat transfer medium, or has been radiated. The spheres may still be at a high temperature, rending the spheres malleable. The spheres then pass into the liquid environment which preferably comprises a low temperature inert liquid material such as a supply of liquid nitrogen. The liquid environment further cools the spheres to remove the specific heat and to harden the spheres. The liquid environment also acts as a cushioning medium to prevent the spheres from mechanically deforming by colliding with each other or the walls and the bottom of the upper and lower chambers.

In one preferred embodiment a low temperature liquid material is dispensed both into a top portion and into a bottom portion of the controlled temperature solidification environment. The low temperature liquid dispensed from the top portion is dispensed into the gaseous environment and at least partially vaporizes thus keeping the gaseous environment at a preferred low temperature. In certain embodiments it is contemplated that the top dispensed liquid can contact the descending spheres to quicken their cooling.

In a preferred embodiment, the bottom portion of the controlled temperature solidification environment comprises a funnel which contains the second or liquid environment. The liquid environment cushions the spheres prior to the spheres hitting the bottom of the funnel. No further processing steps need to be carried out on the finished spheres once the spheres have passed with the liquid environment pool. There is no need to remove any oil or other materials from the surface of the spheres.

It is within the contemplated scope of the present invention to monitor and respond to any changes in the operating parameters for forming the uniformly sized spheres. A first thermocouple measures the temperature at the top portion of the controlled temperature solidification environment and a second thermocouple measures the temperature at the bottom portion of the controlled temperature solidification environment. A differential pressure sensor monitors the pressure of the crucible. A data acquisition/control system is operatively connected to the pressure sensors, the thermocouples, the sphere generation means and the visual observation system. The data acquisition/control system collects pressure and temperature measurement data and controls the sphere generation means. The data aquisition/control system and the visual observation system provide the feasibility of actively controlling the size of the spheres being generated. The size of the sphere is measured by the visual observation system. The data acquisition/control system receives continuous and updated information on the crucible pressure and the frequency provided by the stimulation actuator means so that the sphere diameter is kept at a predetermined size. It is to be understood that the actual size of the spheres being generated depends upon the end use requirements.

According to the present invention, the formation of spheres and the control over sphere shape and diameter is accurate to within microns. The spheres have a diameter that are precise to within about 1% of each other. The present invention is a further improvement over the Chun et al. '098 technology since the spheres produced according to the present invention have a substantially spherical and smooth surface. The spheres of the present invention have high degree of sphericity where the diameters through any section of a sphere vary less than about 1.0%.

The method and apparatus of the present invention are useful for forming uniformly sized and shaped spheres having diameters that range from about 12 to about 1000 microns. The present invention is particularly useful for forming large spheres having a diameter greater than about 500 and in certain preferred embodiments about 760 microns (0.030 inches±0.0003). The enclosed controlled temperature solidification environment controls the rate of transition from the liquid state to the solid state of the spheres. The volume and surface ratio of the spheres being formed affects the rate of cooling of the spheres. The larger diameter spheres are solidified at a controlled rate within the controlled temperature solidification environment so that the spheres maintain a substantially round and smooth surface and have a uniform shape.

The operating parameters, including orifice diameter, frequency and amplitude of the periodic disturbances of the spheres, can be varied so that spheres having different diameters can be formed. It is to be understood that the optimum diameter of the spheres depends, in part, upon the type of sphere being formed. Other parameters, such as feed rate of the metal into the crucible, crucible pressure, temperature of the material being formed into spheres, and the amount of charge on the spheres also affect the size and rate of formation of the uniformly sized and shaped spheres.

It is to be understood that the temperature of the low viscosity liquid material itself affects the thermal state of the spheres. In certain embodiments, the temperature of the material can vary from just above the melting point, and in other embodiments can be, for example, about 50° C. above the melting point of the material. This difference in the temperature of the material affects the rate of solid sphere formation.

In certain embodiments of the present invention, another parameter which can be varied is the "stand-off" distance between the sphere generation means and the point in time where the sphere solidifies.

The present invention allows the spheres to solidify more quickly than in a conventional droplet formation apparatus. In preferred embodiments, the spheres descend through the enclosed controlled temperature solidification for about 0.5 to about 1.5 seconds prior to contacting the bottom of the enclosed environment. The enclosed controlled temperature solidification environment allows the spheres to be formed in a much shorter distance (about 1 to about 5 meters versus 10 to 20 meters found in conventional sphere forming apparatuses) and in a much shorter time (about 0.5 to about 1.5, preferably about 0.8 seconds versus 7 to 10 seconds).

The formation of the spheres in the controlled temperature solidification environment allows the spheres to be formed substantially without any contamination or oxidation.

In preferred embodiments, the spheres are formed from a low viscosity fluid, including, for example, glasses, ceramics and metals. In certain embodiments, it is within the contemplated scope of the present invention that the spheres can be formed of a wide variety of metals including tin/lead solder alloys, gold, aluminum, steel or copper alloy. In addition, the spheres can be plated with precious metals such as silver, gold or palladium or can be coated with organic coatings to prevent oxidation after their formation. The spheres are especially useful in such applications as solder for interconnection of integrated circuits to printed circuit boards, especially ball grid arrays, chip scale packages and flip chip packages.

In certain embodiments, the spheres formed according to the present invention are especially useful in a solder composition and the spheres do not need any additional flux materials to prevent oxide formation on the surface of the spheres.

While certain preferred embodiments have been shown and described herein, it is to be understood that the invention is not limited thereto, but may be embodied with the scope of the following claims.

DESCRIPTION OF THE PREFERRED EMBODIMENT

Figure 1:
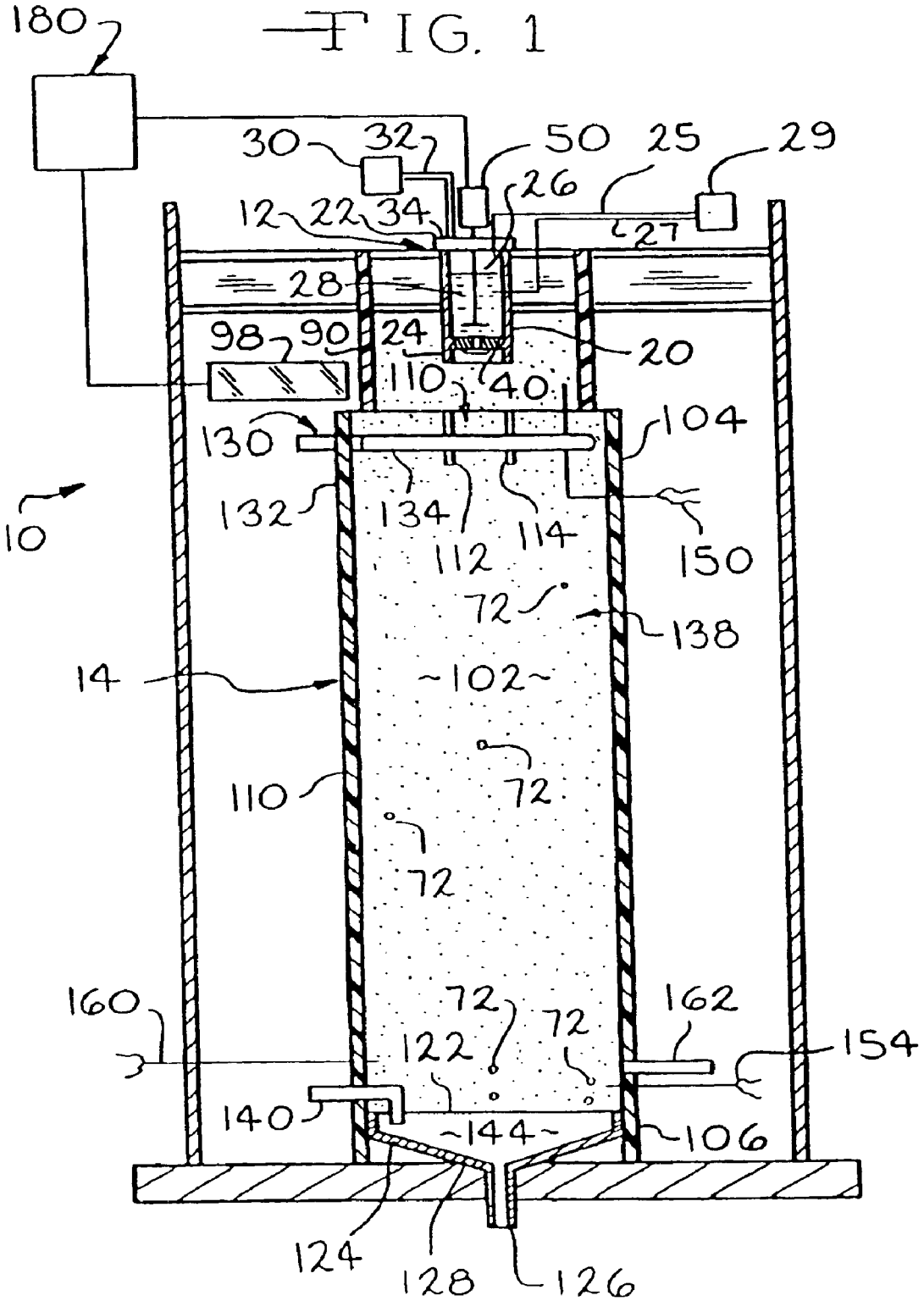
FIG. 1 is a schematic illustration of an apparatus for forming uniformly sized and shaped spheres in accordance with the invention.
Figure 1A:
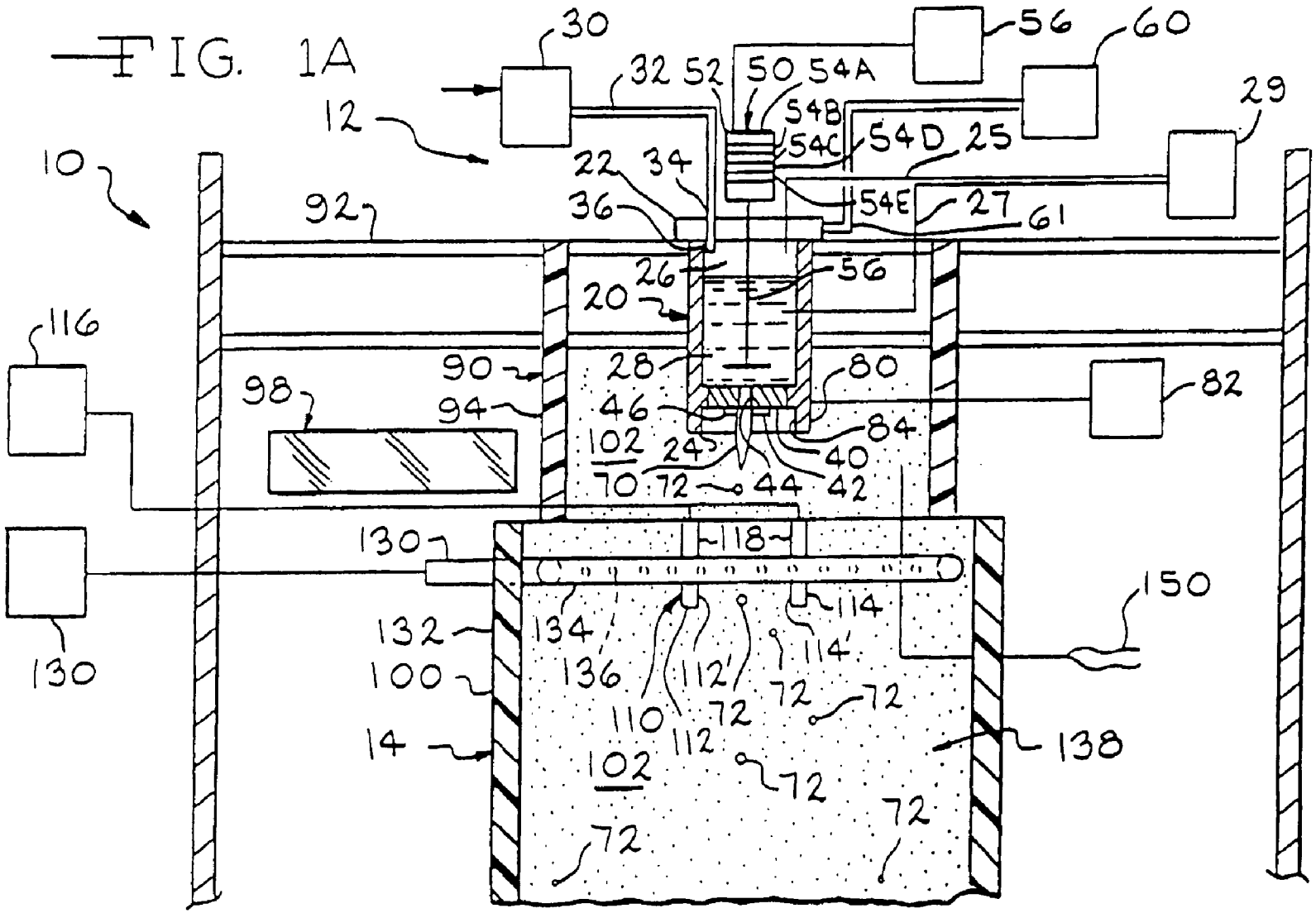
FIG. 1A is an enlarged view of a portion of FIG. 1.

Referring now to the drawings, an apparatus 10 for forming uniformly sized and shaped spheres is generally shown. The apparatus 10 comprises at least one sphere generation means 12 and an enclosed controlled temperature solidification environment 14. The sphere generation means 12 generally comprises a crucible 20 and a stimulation actuator means 50. The crucible 20 has a top portion 22 which is in a spaced apart relationship to a bottom portion 24. The crucible 20 defines an enclosed space 26 which contains a supply of a low viscosity liquid material 28. In certain high temperature applications, the crucible 20 is made of a ceramic material. The temperature inside the crucible 20 is monitored by a thermocouple probe 25 and a temperature controller 27 which are operatively connected to a heating means 29. The heating means 29 maintains the material 28 at a temperature above its melting point. The crucible 20 is operatively connected to a pressure regulator means 30 by a supply means 32 at a supply inlet 34. The pressure in the crucible 20 is monitored by a pressure transducer 36 located near the inlet 34. The pressure in the crucible 20 is adjusted by the pressure regulator means 30. It is within the contemplated scope of the present invention that the pressure regulator means 30 can supply a positive pressure of an inert gas such as nitrogen to the crucible 20.

The crucible 20 has an end cap 40 with a nozzle 42 detachably connected to the bottom portion 24. The nozzle 42 is attached at generally the center of the end cap 40. The nozzle 42 defines at least one orifice 44. In a preferred embodiment, the orifice 44 has an inside diameter in the range of about 12 to about 1000 microns. It is within the contemplated scope of the present invention that the nozzle 42 can have more than one orifice 44. For ease of illustration however, only one orifice will be discussed in detail. In a preferred embodiment, a sapphire nozzle is used which can be operatively attached to the end cap 40 using a high temperature ceramic material. In other embodiments, a ceramic nozzle can be used. The nozzle 42 fits into a tapered fitting at the center of the end cap 40. In a preferred embodiment, the nozzle 42 is secured to the end cap 40 using, for example, a jam nut 46.

The stimulation actuator means 50 provides a periodic disturbance to the low viscosity liquid material 28. In the embodiment shown, the stimulation actuator means 50 comprises a stack 52 of piezoelectric crystals 54 operatively connected to the top portion 22 of the crucible 20. In a preferred embodiment, the piezoelectric stack 52 contains at least 5 piezoelectric crystals 54A, 54B, 54C, 54D and 54E. The bottom four crystals 54B, 54C, 54D and 54D are mechanically connected in serial and electrically conducted in parallel to a high sinusoidal voltage source 56. The top piezoelectric crystal 54A serves as a motion sensor. The output voltage of the motion sensor 54A provides an indication of the amplitude of the stimulation actuator means 50. An extender means 56, such as a stirring rod, is attached to the bottom of the piezostack 52. The stimulation of the piezostack 52 is transferred to the material 28 by the extender means 56.

It is also within the contemplated scope of the present invention that the simulation actuator means 50 can comprise a monolithic multilayered piezoactuator (not shown) containing, for example, 25 to 30 and, in certain preferred embodiments 29 layers, of piezoelectric ceramic cofired together having the dimensions of approximately 5 millimeters by 5 millimeters by 5 millimeters and being capable of over 3 microns of expansion.

In an alternative embodiment, the stimulation to the material 28 can be provided by using a piezoelectric ceramic material as a nozzle material. A sinusoidal voltage is directly applied on the nozzle causing a periodic disturbance in the nozzle.

In certain embodiments the pressure regulator means 30 includes a vacuum pump 60 operatively connected to the top portion 22 of the crucible 20 through an inlet 61. The vacuum pump 60 keeps the crucible 20 at a negative pressure prior to the formation of the spheres. The negative pressure prevents the material 28 from escaping through the nozzle 42 prior to operation of the sphere generation means 12.

During operation of the sphere forming apparatus 10, an applied constant pressure from the pressure regulator means 30 forces the material 28 out of the nozzle 42 and into the controlled temperature solidification environment 14. The material 28 forms a steady laminar jet or stream 70 of material. The stimulation from the stimulation actuator means 50 causes a periodic disturbance to the stream 70. Due to the phenomena of the Rayleigh instability effect, the stream 70 breaks up into uniformly sized and uniformly spaced spheres 72.

A charging system 80 is attached to the crucible end cap 40. The distance between the charging system 80 and the end cap 40 can be adjusted depending on the desired operating parameters. In a preferred embodiment the charging system 80 can be an aluminum material. A high voltage is applied to the charging system 80 from a voltage source 82. The stream 70 breaks into droplets 72 while passing through an opening 84 in the charging system 80. The charging system 80 imparts a charge on the stream 70. As the spheres 72 form, the spheres 72 retain the charge. The charge in the spheres 72 exerts a force between adjacent spheres 72 and prevents the spheres 72 from merging.

The charged spheres 72 pass through the enclosed controlled temperature solidification environment 14 which, in the embodiment shown, comprises a first or gaseous environment 102 and a second or liquid environment 122.

In the embodiment shown, the enclosed controlled temperature solidification environment 14 includes an upper chamber 90 and a lower chamber 100. In certain embodiments the upper chamber 90 is maintained at a first temperature and the low chamber 100 is maintained at a second temperature. The first and second temperatures define a temperature gradient within the enclosed controlled temperature solidification environment 14. In an embodiment where the spheres being formed are made of a tin/lead alloy, it is desired that the first temperature in the upper chamber 90 ranges from about room temperature to about −90° C. (in certain embodiments about 0° C.) while the second temperature in the lower chamber 100 ranges from about −110° to about −170° C.

The sphere generation means 12 is mounted inside the upper chamber 90 by a support bar 92. The upper chamber 90 is sealingly engaged to the lower chamber 100. The upper chamber 90 is in communication with the lower chamber 100 such that the upper chamber 90 and the lower chamber 100 define the first or gaseous enclosed environment 102. The upper chamber 90 has at least one portion 94 which is transparent. In a preferred embodiment, the upper chamber 90 comprises an acrylic material having, for example, the dimension of approximately 12×12×24 inches. A visual observation system 98 is located adjacent to the transparent portion 94 of the upper chamber 90. The visual observation system 98 monitors the formation of the spheres 72 and measures the size of the spheres as the spheres pass the visual observation system 98.

The lower chamber 100 has at least one wall 104 and a bottom portion 106. In certain embodiments, the lower chamber 100 is preferably made of a CPVC tube material and has preferably a 14 inch interior diameter. The lower chamber 100 includes a deflection means 110. In the embodiment shown the deflection means 110 includes two deflection plates 112 and 114. The plates 112 and 114 each have a repelling or charging surface 112' and 114', respectively. The distance between the adjacent plates 112 and 114 defines an opening 118 through which the charged spheres 72 pass. The attracting or repelling surfaces 112' and 114' are preferably made of a highly conductive material such as copper, aluminum, steel or the like and have a length, in certain embodiments, from about 150 to about 400 millimeters. The opening 118 between the surfaces 112' and 114' is generally about 10 to about 40 millimeters. It is to be understood that in other embodiments, these lengths and distances are dependent, at least in part, on the type of low viscosity liquid material, the size of the spheres being generated, and other operating parameters. As the spheres 72 descend, the spheres pass through the deflection means 110. A high voltage is applied across the deflection means 110 from a voltage source 116. The high voltage generates an electric field between the plates 112 and 114. Since the spheres 72 are charged, the electric field either attracts or deflects the spheres 72. The deflection distance of the spheres is a function of the charge, size and speed of the spheres. The bigger spheres 72 descend in a path close to a center axis through the deflection means 110 while smaller spheres are deflected away from the center axis of the deflection means 110.

The bottom portion 106 of the lower chamber 100 contains the liquid environment 122. In preferred embodiments the bottom portion 106 includes a funnel 124 made of a stainless steel material. A cryogenic valve 126 is located at a bottom portion 128 of the funnel 124. By opening the valve, the spheres 72 in the funnel 124 can be collected and retrieved.

The lower chamber 100 includes a first or upper heat transfer medium inlet supply means 130 which is located at an upper portion 132 of the lower chamber 100. The inlet supply means 130 comprises, in a preferred embodiment, a copper tubing 134 which circumferentially extends adjacent the wall 104 of the lower chamber 100. The copper tubing 134 has a plurality of openings 136 radially extending through the tubing 134. In a preferred embodiment the openings 136 are generally evenly spaced around the copper tubing 134. The openings 136 allow a first heat transfer medium 138 to be dispensed into the lower chamber 100. Since the lower chamber 100 is in communication with the upper chamber 90, the heat transfer medium 138 cools both the upper chamber 90 and the lower chamber 100. In embodiments where the heat transfer medium 138 comprises liquid nitrogen, the heat transfer medium keeps the temperature in the gaseous enclosed environment 102 below about −80° C. to about −170° C.

In the embodiment shown, the lower chamber 100 also has a second or lower heat transfer medium supply means 140 which is positioned adjacent, but in a spaced apart relationship, to the funnel 124. The funnel 124 is filled with a predetermined quantity of a second heat transfer medium 144. It should be understood that the first and second heat transfer media can be the same material, or can be different materials, for example a liquefied gas such as nitrogen and/or a liquid halo-carbon. The supply of the second heat transfer medium 144 defines second or liquid environment 122. The controlled temperature solidification environment 14, which, in the embodiment shown, comprises the gaseous environment 102 and the liquid environment 122, allows the spheres 72 to solidify before contacting the bottom 128 of the funnel 124. The heat of fusion is removed in the gaseous environment 102. The specific heat is removed in the liquid environment 122. The liquid environment 122 in the funnel 124 cushions the spheres 72 before the spheres 72 contact the funnel 124.

In the embodiment shown, a first thermocouple 150 monitors the temperatures of the upper chamber 90 and a second thermocouple 154 monitors the temperatures of the lower chamber 100 so that the gaseous environment 102 and the liquid environment 122 remain at preferred sphere solidification temperatures. It is to be understood, however, that additional thermocouples can be used to monitor the temperature gradient in the enclosed controlled temperature solidification environment 14.

Before operation of the sphere generation means 12, the enclosed controlled temperature solidification environment 14 and the crucible 20 are purged with a dry and inert gas. An oxygen content monitor 160 is positioned within the chamber 100 to monitor the oxygen content throughout the operation of the uniform size sphere forming apparatus 10. A relief valve means 162 extends from the enclosed controlled temperature solidification environment 14 to provide a desired pressure and amount of heat transfer medium in the controlled temperature solidification environment 14.

In operation, the orifice 44 in the nozzle 42 is aligned with the opening 84 in the charging system 80. The charging system 80 applies a charge to the stream of material 70. As each sphere 72 is formed and breaks from the stream 70, each sphere 72 retains a portion of the charge. As the charged spheres 72 descend, the spheres pass through or adjacent the charging plates 112 and 114 of the deflection means 110.

When the charging or repelling surfaces 112' and 114' are held at a predetermined desired voltage, the electrical field generated in the opening 118 provides a further charge to the spheres 72. The spheres 72 remain a predetermined distance from each other and from the charging or repelling surfaces 112' and 114'. This repelling force is generally shown by the arrows in FIG. 2. As each sphere 72 descends, the leading sphere is repelled, not only from succeeding spheres 72, but is also repelled from the sides of the charging surfaces 112' and 114', thereby preventing the like charged spheres from merging with each other.

It is to be understood that various suitable materials can be used, depending upon the end use application of the spheres to be formed. The actual charge on the sphere is a function, not only of the type of metal used, but also the diameter of the spheres, and the voltage between the charging plates 112 and 114 and the spheres 72. A charge on the sphere 72 in the order of $10^{-7}$ coulmb-gram is useful; however, it is to be understood that other charges are also useful and that the charges depend on the various parameters discussed above.

Figure 2:
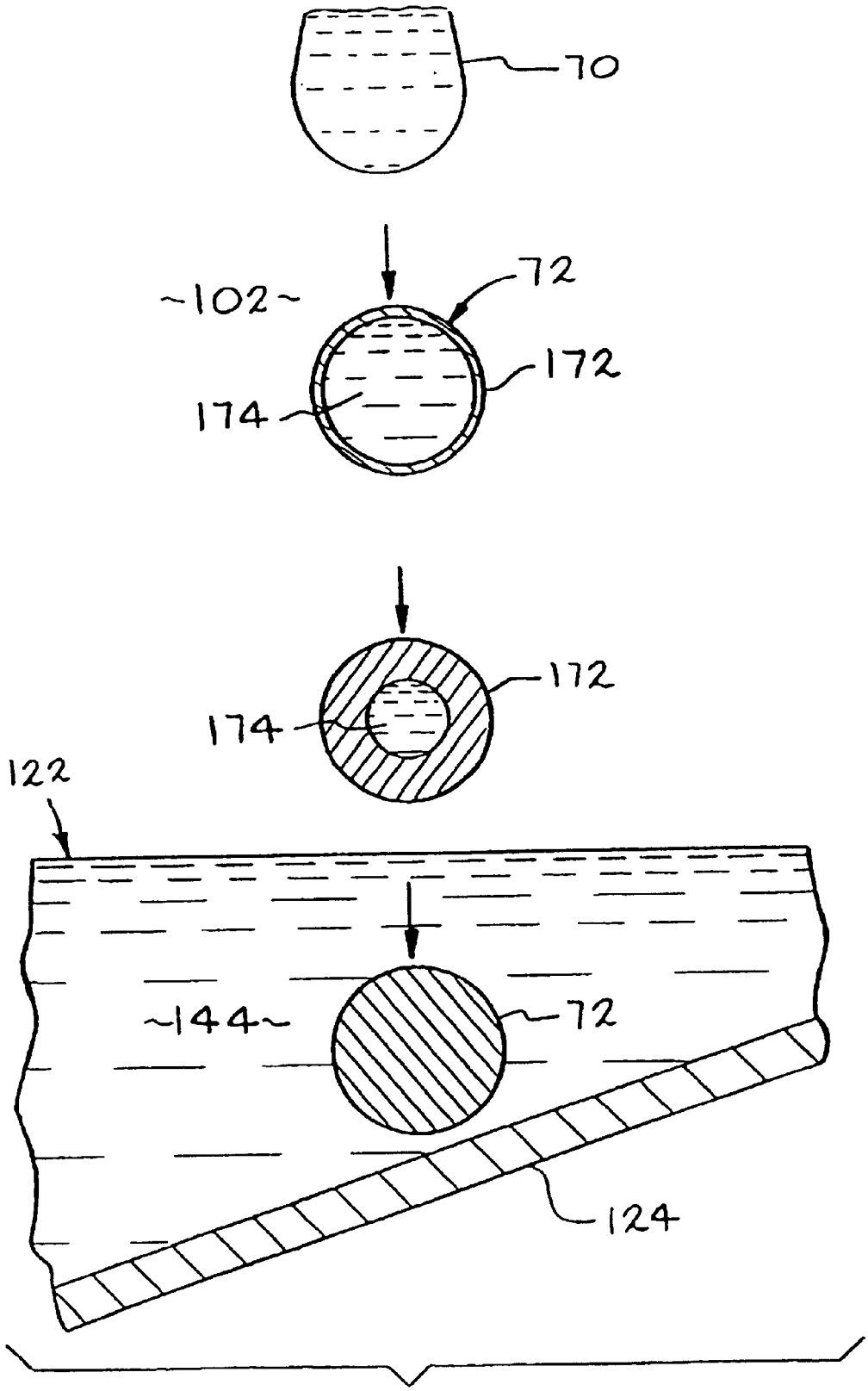
FIG. 2 is a greatly enlarged cross-sectional view of spheres as the spheres are being cooled.

The charged spheres 72 solidify during the descent through the gaseous environment 102 and are completely solidified before contact with the liquid environment 122. As seen in FIG. 2, the spheres 72 first form a skip portion 172 which shields a molten portion 174. As the spheres 72 descend and solidify, the skin portion 172 thickens until the molten portion 174 disappears prior to contact of the sphere 72 with the funnel 124.

It is to be further understood that the sphere forming apparatus 10 of the present invention is operatively connected to a data acquisition/control system 180 to collect and measure data and to control the sphere forming apparatus. The data acquisition/control system 180 also measures the voltage output of the thermocouples and pressure transducers. The data acquisition/control system 180 is also operatively connected to the visual observation system 98 to provide the capability of actively controlling the formation of the spheres. During operation of the apparatus 10, the size and shape of the spheres being generated are measured. The data acquisition/control system 180 varies the crucible pressure and frequency generated by the stimulation actuator means 50 so that the sphere size and shape are kept at a predetermined desired diameter.

It is to be understood that only the preferred embodiments of the invention have been described and the numerous substitutions, modifications and alternations are permissible without departing from the spirit and scope of the invention as defined in the following claims.

We claim:

1. A method for forming and solidifying uniform sized and shaped solid spheres comprising the steps of:

providing a supply of a low viscosity liquid material in a crucible, applying a minute periodic disturbance to the low viscosity liquid material in the crucible, applying a pressure to the low viscosity liquid material, the pressure forcing the material through at least one orifice in the crucible as a steady laminar stream, the stream of the material exiting into an enclosed controlled low temperature solidification environment having a temperature of less than about 0° C., the enclosed controlled low temperature solidification environment containing at least [one] *a first* heat transfer medium *and a second heat transfer medium*, the *first heat transfer medium and the second* heat transfer medium forming a heat gradient within the enclosed controlled low temperature solidification environment;

[applying a charge to] *breaking* the stream of material [as the stream exits the orifice and breaks] up into a plurality of uniform sized and shaped liquid spheres, *and*

[passing the charged liquid spheres through an electric field to deflect the liquid spheres, and]

allowing the liquid spheres to pass through the *first* heat transfer medium *and the second heat transfer medium* in the enclosed controlled low temperature solidification environment to cool and solidify into the uniform sized and shaped solid spheres.

2. The method of claim 1, in which the enclosed [controlled] *controlled* temperature solidification environment includes a first[,] *or* gaseous environment through which the [charged] spheres are passed, the first[,] *or* gaseous environment containing the first heat transfer medium which comprises a spray of cooling fluid, liquefied gas or halocarbon which evaporates in the enclosed controlled temperature solidification environment and which absorbs the heat of fusion from the spheres.

3. The method of claim 2, in which the enclosed [controlled] *controlled* temperature solidification environment includes a second[,] *or* liquid environment through which the spheres pass after passing through the first[,] *or* gaseous environment[;], the second[,] *or* liquid environment containing [a] *the* second heat transfer medium which comprises a supply of a liquid material.

4. The method of claim 3, comprising passing the spheres through the second[,] *or* liquid environment to remove heat from the spheres and to cushion the spheres before the spheres contact a bottom of the enclosed controlled temperature solidification environment.

5. The method of claim 3, comprising varying a distance defined between a point at which the stream breaks into the spheres and a point at which the spheres contact the second or liquid environment.

6. The method of claim 1, further including the step of visually monitoring the stream of low viscosity liquid material as the stream breaks into spheres to provide information on the diameter and shape of the spheres and the stability of the stream.

7. The method of claim 1, comprising collecting the solidification spheres in a funnel-shaped bottom of the enclosed controlled temperature solidification environment.

8. The method of claim 1, in which the solid spheres have a diameter ranging from about 12 to about 1000 microns.

9. The method of claim 1, in which the spheres pass through the enclosed controlled temperature solidification environment for about 0.5 to about 1.5 seconds prior to contacting a bottom of the enclosed controlled temperature solidification environment.

10. The method of claim 1, comprising applying the minute periodic disturbance to the low viscosity liquid material by a piezoelectric actuator.

11. The method of claim 10, in which the piezoelectric actuator comprises a stack of piezoelectric crystals mounted on a top portion of the crucible.

12. The method of claim 1, comprising applying the minute periodic disturbance to the low viscosity liquid material by an electromechanical transducer mounted on a top portion of the crucible.

13. The method of claim 1, comprising applying the minute periodic disturbance with a nozzle that has a fixed aspect ratio defining the orifice.

14. The method of claim 1, comprising applying a substantially constant positive pressure to the low viscosity liquid material to force the low viscosity liquid material out through the orifice in a steady laminar stream.

15. The method of claim [1] *29*, in which the deflection means comprises two spatially separated surfaces and comprising generating the [electrical] *electric* field between the two surfaces to deflect the [descending] *liquid* spheres.

16. A method for forming uniform sized and shaped spheres comprising the steps of:

providing a supply of a low viscosity liquid material in a crucible, applying a minute periodic disturbance to the low viscosity liquid material in the crucible, applying a pressure to the low viscosity liquid material, the pressure forcing the material through at least one orifice in the crucible as a steady laminar stream, the stream of the material exiting into an enclosed [controlled] *controlled* temperature solidification environment;

[applying a charge to] *breaking* the stream of material [as the stream exits the orifice and breaks] up into a plurality of uniform sized and shaped liquid spheres; *and*

[passing the charged liquid spheres through an electric field to deflect liquid the spheres; and]

allowing the spheres to pass through first and second media in an enclosed controlled temperature solidification environment to cool and solidify the spheres;

the enclosed controlled temperature solidification environment including a first[,] *or* gaseous environment through which the charged spheres are passed, the first[,] *or* gaseous environment containing the first medium which comprises a spray of cooling fluid, liquefied gas or halo-carbon, the first medium evaporating in the enclosed controlled temperature solidification environment and absorbing the heat of fusion from the spheres;

the enclosed controlled temperature solidification environment also including a second[,] *or* liquid environment through which the spheres pass after passing through the first, gaseous environment, the second[,] *or* liquid environment containing the second medium which comprises a supply of a liquid material, the second medium cushioning the spheres before the spheres contact a bottom of the enclosed controlled temperature solidification environment.

17. The method of claim 16, further including the step of visually monitoring the stream of low viscosity liquid material as the stream breaks into spheres to provide information on the diameter and shape of the spheres and the stability of the stream.

18. The method of claim 16, comprising collecting the solidified spheres in a funnel-shaped bottom of the enclosed controlled temperature solidification environment.

19. The method of claim 16, in which the spheres have a diameter ranging from about 12 to about 1000 microns.

20. The method of claim 16, in which the spheres pass through the enclosed controlled temperature solidification environment for about 0.5 to about 1.5 seconds prior to contacting a bottom of the enclosed controlled temperature solidification environment.

21. The method of claim 16, in which the enclosed low temperature solidification environment is at a temperature of less than about 0° C.

22. The method of claim 16, comprising varying a distance defined between a point at which the stream breaks into the spheres and a point at which the spheres contact the second, liquid environment.

23. The method of claim 16, comprising applying the minute periodic disturbance to the low viscosity liquid material by a piezoelectric actuator.

24. The method of claim 23, in which the piezoelectric actuator comprises a stack of piezoelectric crystals mounted on a top portion of the crucible.

25. The method of claim 16, comprising applying the minute periodic disturbance to the low viscosity liquid material by an electromechanical transducer mounted on a top portion of the crucible.

26. The method of claim 16, comprising applying the minute periodic disturbance with a nozzle that has a fixed aspect ratio defining the orifice.

27. The method of claim 16, comprising applying a substantially constant positive pressure to the low viscosity liquid material to force the low viscosity liquid material out through the orifice in a steady laminar stream.

28. The method of claim 16, in which the deflection means comprises two spatially separated surfaces and comprising generating the electrical field between the two surfaces to deflect the descending spheres.

*29. The method of claim 1, further comprising steps of:*

*applying a charge to the stream of material as the stream exits the orifice; and*

*passing liquid spheres to which the charge has been applied through an electric field to deflect the charged liquid spheres.*

*30. The method of claim 16, further comprising steps of:*

*applying a charge to the stream of material as the stream exits the orifice; and*

*passing liquid spheres to which the charge has been applied through an electric field to deflect the charged liquid spheres.*

*31. A method for forming and solidifying uniform sized and shaped solid spheres comprising the steps of:*

*applying a pressure to low viscosity liquid material contained in a crucible, the pressure forcing the material through at least one orifice in the crucible as a steady laminar stream, the stream of the material exiting into an enclosed controlled low temperature solidification environment having a temperature of less than about 0° C., the enclosed controlled low temperature solidification environment containing at least a first heat transfer medium and a second heat transfer medium, the first heat transfer medium and the second heat transfer medium forming a heat gradient within the enclosed controlled low temperature solidification environment; and*

*allowing the liquid material to pass through the first heat transfer medium and the second heat transfer medium in the enclosed controlled low temperature solidification environment to cool and solidify into the uniform sized and shaped solid spheres.*

*32. A method for forming and solidifying uniform sized and shaped solid spheres, the method comprising:*

*providing a supply of a low viscosity liquid material in a crucible,*

*applying a minute periodic disturbance to the low viscosity liquid material in the crucible,*

*applying a pressure to the low viscosity liquid material, the pressure forcing the material through at least one orifice in the crucible as a steady laminar stream, the stream of the material exiting into an enclosed controlled low temperature solidification environment having a temperature of less than about 0° C., the enclosed controlled low temperature solidification environment having a top portion and a bottom portion containing at least one heat transfer medium provided to the top portion of the temperature solidification environment at a first temperature and provided to the bottom portion of the temperature solidification environment at a second temperature to establish a heat gradient within the enclosed controlled low temperature solidification environment;*

*breaking the stream of material up into a plurality of uniform sized and shaped liquid spheres, and*

*allowing the liquid spheres to pass through the heat transfer medium in the top portion and the bottom portion of the enclosed controlled low temperature solidification environment to cool and solidify into the uniform sized and shaped solid spheres.*

*33. The method of claim 32 wherein forming the heat gradient includes the enclosed controlled temperature solidification environment including a first or gaseous environment containing the first heat transfer medium at a temperature of a first desired value through which the liquid spheres pass.*

*34. The method of claim 33 wherein the first heat transfer medium includes a spray of cooling fluid, liquefied gas or halo-carbon which evaporates in the enclosed controlled temperature solidification environment and which absorbs the heat of fusion from the liquid spheres.*

*35. The method of claim 33 wherein forming the heat gradient further includes the enclosed controlled temperature solidification environment including a second or liquid environment containing a second heat transfer medium at a temperature of a second desired value through which the liquid spheres pass after passing through the first or gaseous environment.*

*36. The method of claim 35 wherein the second heat transfer medium includes a supply of liquid material which removes heat from the spheres and which cushions the spheres before the spheres contact a bottom of the enclosed controlled temperature environment.*

*37. The method of claim 32, wherein the at least one heat transfer medium includes one of a cooling fluid, a liquefied gas and a liquid halo-carbon.*

*38. The method of claim 37, wherein the at least one heat transfer medium in the first portion of the temperature solidification environment absorbs heat of fusion from the liquid spheres.*

*39. The method of claim 32, wherein the bottom portion of the temperature solidification environment includes a second heat transfer medium.*

*40. The method of claim 39, wherein the second heat transfer medium includes a supply of a liquid material which removes heat from the spheres.*

* * * * *

UNITED STATES PATENT AND TRADEMARK OFFICE

CERTIFICATE OF CORRECTION

PATENT NO. : RE 39,224 E
APPLICATION NO. : 09/827605
DATED : August 8, 2006
INVENTOR(S) : Tang et al.

It is certified that error appears in the above-identified patent and that said Letters Patent is hereby corrected as shown below:

In the Claims

Column 12, line 51 in claim 7 change the word "solidification" to read --solidified--

Signed and Sealed this

Tenth Day of October, 2006

JON W. DUDAS
*Director of the United States Patent and Trademark Office*